United States Patent [19]

Rutz

[11] Patent Number: 4,489,128
[45] Date of Patent: Dec. 18, 1984

[54] STRUCTURE CONTAINING EPITAXIAL CRYSTALS ON A SUBSTRATE

[75] Inventor: Richard F. Rutz, Cold Spring, N.Y.

[73] Assignee: International Business Machines Corporation, Armonk, N.Y.

[21] Appl. No.: 472,392

[22] Filed: Mar. 4, 1983

Related U.S. Application Data

[62] Division of Ser. No. 280,145, Jun. 30, 1981, Pat. No. 4,382,837.

[51] Int. Cl.³ .................... B32B 19/00; H01L 21/205
[52] U.S. Cl. .................................. 428/332; 428/446; 428/698; 428/700; 252/62.3 C; 156/610

[58] Field of Search ............... 428/446, 323, 332, 698

[56] References Cited

U.S. PATENT DOCUMENTS

| 4,147,572 | 4/1979 | Vodakov et al. | 156/610 |
| 4,368,098 | 1/1983 | Manaseuit | 156/610 |
| 4,382,837 | 5/1983 | Rutz | 156/610 |

Primary Examiner—Patricia C. Ives
Attorney, Agent, or Firm—Pollock, Vande Sande & Priddy

[57] ABSTRACT

Crystals of silicon carbide and aluminum nitride, substrates containing same, and the fabrication thereof.

8 Claims, 3 Drawing Figures

STRUCTURE CONTAINING EPITAXIAL CRYSTALS ON A SUBSTRATE

This is a division of application Ser. No. 280,145, filed June 30, 1981 and now U.S. Pat. No. 4,382,837.

DESCRIPTION

1. Technical Field

The present invention is concerned with certain silicon carbide and aluminum nitride crystals, and particularly is concerned with the single crystals of certain relative amounts of silicon carbide and aluminum nitride. In addition, the present invention is concerned with structures containing silicon carbide and aluminum nitride crystals on a substrate. Furthermore, the present invention is concerned with the process for growing crystals of silicon carbide and aluminum nitride whereby the composition can be closely and reliably controlled.

2. Background Art

Solid solutions of mixed semiconductor crystals of either III-V Group systems or II-VI Group systems are known and are generally continuous across various composition amount ranges. However, it is quite difficult to reliably produce a homogeneous mixture of a particular composition to within a few percent accuracy. Mixed crystals in the Groups III-IV-V systems are exceedingly more difficult to produce reproducibly. Moreover, in the IV-IV system, a unique situation exists in mixed crystals of silicon and carbon in that only one composition silicon carbide exists as a compound. The other combinations which result from the very slight solubilities of silicon in single crystals of carbon, and carbon and single crystals of silicon are generally described as impurities of one element in the crystal of the other, rather than as mixed crystals. Likewise, in the case of a semiconductor compound where there is the presence of a small amount on the order of a few percent or less of a foreign atom, reference is made to a single crystal of the host lattice constituent with an impurity. On the other hand, when there is a substantial amount of a foreign atom present, reference is made to a mixed crystal including the original host atoms and the foreign atom.

With respect to SiC:AlN systems which are of the III-IV-IV-V Group, there is very little published literature. In particular, U.S. Pat. No. 3,634,149 refers to the growth of mixed SiC:AlN crystals epitaxially on SiC platelets but only at temperatures in excess of 2100° C. However, in spite of extensive research efforts over many years, the search for a method of producing reproducible SiC single cyrstal platelets of a size sufficiently large to make it economically useful for single crystal electronic semiconductor devices or as a substrate have not been successful.

A high temperature substrate that is available and economically suitable is sapphire. For example, silicon epitaxially grown on sapphire as an integrated circuit material is well known. The use of sapphire as a substrate is possible, however, only at temperatures below the melting point of sapphire which is 2040° C. This is well below the 2100° C. minimum mentioned in U.S. Pat. No. 3,634,149 for growth of mixed SiC:AlN crystals. Another publication on SiC:AlN mixed crystals is an article by I. B. Cutler et al. in Nature, Volume 275, October 1978, pp. 434-435. This article deals with ceramic methods of growing SiC:AlN which generally produce small size polycrystalline material. The process suggested therein employs growing the material at temperatures of about 1400° C.–1600° C. The process suggested does not involve epitaxial growth on a substrate.

DISCLOSURE OF INVENTION

The present invention, accordingly, is concerned with providing a semiconductor crystal material having a wide band gap in the ultraviolet region which can be produced accurately and reproducibly. In particular, the present invention is concerned with a single epitaxial crystal composition of $(SiC)_x(AlN)_{1-x}$ wherein x is about 0.2 to about 0.5, and preferably about 0.3 to about 0.5. The above single crystal composition is very reproducible. The above composition is indicated by X-ray analysis of the C-axis lattice parameter and using Vegard's law. In addition, the X-ray analysis indicates a 2H crystal form. The preferred crystals of the present invention are C-axis or $C_x$ crystals.

The present invention is also concerned with epitaxial crystals of $(SiC)_x(AlN)_{1-x}$ on a substrate.

The process of the present invention is concerned with growing a crystal of $(SiC)_x(AlN)_{1-x}$ wherein x is about 0.2 to about 0.5, which comprises:
providing a substrate;
providing a first source for SiC and a second source for AlN in proximity to the substrate. The source materials are separate from the substrate.

The source materials for the SiC and AlN are heated to a temperature of about 1900° to about 2020° C. in the presence of $N_2$ and $H_2$ gas flowing over the source materials SiC and AlN in the direction towards the substrate.

BEST AND VARIOUS MODES FOR CARRYING OUT INVENTION

Figure 1:
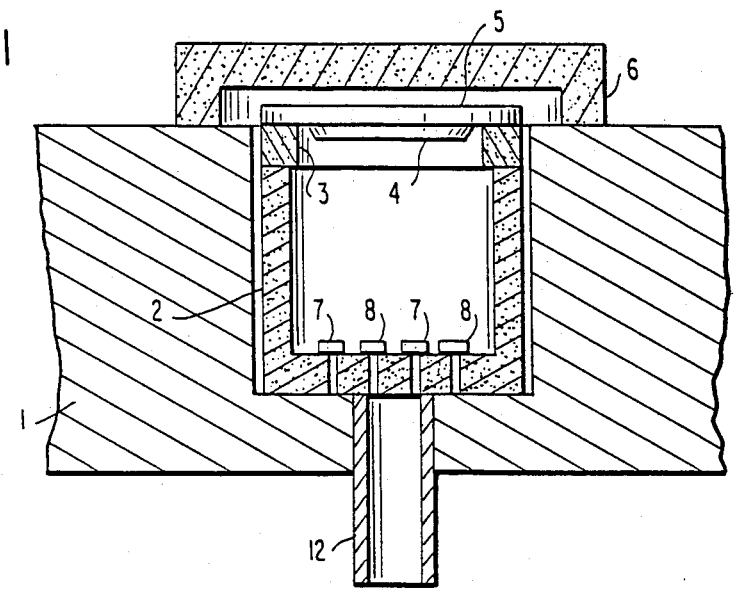
FIGS. 1 and 2 are schematic cross-sectional views of an apparatus suitable for forming the crystals of the present invention.

Referring to FIG. 1, a schematic of a typical structure for practicing the present invention is set forth wherein a resistance heated tungsten crucible 1 provides the source of increased temperature needed. Within resistance heated tungsten crucible is a pyrolytic carbon inner crucible 2 having bottom perforations. A substrate 5 is provided and supported by an annular ring spacer and support 3 which conveniently can be made of silicon carbide, tungsten or carbon. A loosely fitted lid 6, such as tungsten or carbon, is provided. The silicon carbide source is shown as 7 and the aluminum-nitride source material is shown as 8. Gas is conveyed via conduit 12 conveniently made of tungsten to pass over the silicon carbide and aluminum nitride source material in the direction of the substrate 5. The crystal composition grown on the substrate is shown as 4. Substrate 5 is made of a material which does not melt under the conditions of the process and includes <0112> oriented sapphire, <0001> oriented sapphire, tungsten (e.g. <111> single crystal tungsten wafers), SiC and $C_x$AlN epitaxial crystals on top of $C_x$ sapphire. The preferred substrate is sapphire with the most preferred being <0001> sapphire.

Figure 2:
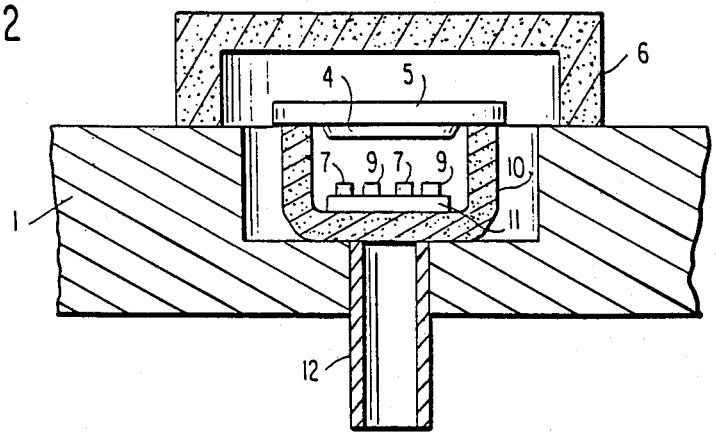

Referring to FIG. 2, there is illustrated a resistance heated tungsten crucible 1 and a tungsten inner crucible 10. Also provided is a loosely fitted lid 6, such as of tungsten or carbon. A silicon carbide source material is shown at 7 and $Al_2O_3$ source material 9 is shown. Both are supported on a carbon disc 11 which is used to react with the $Al_2O_3$ to form AlN. The reaction to form AlN is according to the following equation:

$$Al_2O_3 + N_2 + 3C \rightarrow 2AlN + 3CO.$$

Gas is conveyed to the apparatus via conduit 12. A substrate 5 is supported on inner crucible 10. The epitaxial mixed single crystal of SiC and AlN is provided on substrate 5.

In the operation of the process, the crystals are grown preferably by providing about equal amounts of SiC and AlN source materials, such as in the form of approximately uniform distribution of small fragments of SiC and AlN. Generally, such source materials are spaced about 0.1 to about 5 millimeters from the substrate 5. The reaction forming the mixed crystals involves heating the source materials to a temperature of about 1900° to about 2020° C. and flowing a gas thereover in the direction of the sapphire substrate. The source materials for the SiC and AlN are placed in convection proximity to the substrate 5. The substrate is maintained at a temperature of about 10° to about 100° C. cooler than the temperature of the source materials. The source materials are transported or conveyed in the vapor phase to form the epitaxial grown layer of $(SiC)_x(AlN)_{1-x}$ on the substrate. The growth rate of such is usually on the order of about 1 micron per minute. The preferred gaseous atmosphere employed contains $N_2$ and $H_2$, and most preferably about 85% $N_2$ and about 15% $H_2$ by volume. In addition to insuring that the tungsten does not oxidize, the $H_2$ promotes the growth process.

Instead of SiC, $SiO_2$ or $Si_3N_4$ can be employed along with carbon to generate SiC. Likewise, instead of AlN as the source material, such can be formed in situ from, for instance, $Al_2O_3$ employing carbon and $N_2$ as illustrated in the equation defined hereinabove. Accordingly, when the discussion herein refers to source material for SiC and source material for AlN, such refers to the materials per se as well as those materials which are employed to form AlN and SiC in situ.

The apparatus shown in FIG. 1 which illustrates an inner carbon crucible having a perforated bottom provides for the promotion of the flow of the ambient gas through the system and, accordingly, induces a higher rate or growth. On the other hand, the apparatus in FIG. 2 illustrates the use of a nonperforated inner crucible which limits the diffusion of the gases thereby resulting in a slower growth rate but results in a more uniform nucleation of the desired crystals.

Tests of the crystals grown according to both types of apparatus shown a 2H crystalline form. In addition, temperatures in the range of 1900° to about 2020° C. show a C-axis lattice which very closely matches regardless of the temperature employed. In particular, the range is from about 5.0152 to about 5.0038 Å as determined by X-ray analysis.

Also, the various samples obtained demonstrate absorption edges which vary with the composition of the crystals with the higher energy edges being associated with the more AlN rich compositions. Moreover, the room temperature absorption edge of crystals grown by the present invention is in the range of about 4.3 to 4.8 electron volts. In particular, a crystal with a x value of 0.435 shown an absorption edge of about 4.6 eV which corresponds to about 2700 Å, an ultraviolet wavelength.

The composition obtained appears to be dependent on the temperature used within the above range and the temperature gradient between the source and substrate. On the other hand, the growth rate is a function of the particular geometry of the system employed.

The crystals prepared according to the present invention are about 1 to about 10 microns thick, and the area of such is typically about 1 square centimeter. The crystals are generally of very high elecrical resistance. However, if extreme care is used to keep the source materials as pure as is commercially available and the temperature is as high as possible without melting the substrate, resistivities lower than $10^4$ ohm cm showing N-type conduction are obtained.

The crystals of the present invention have the desirable hardness characteristics of resistance to etching and ability to survive in very high temperatures and corrosive environments as does SiC. It is superior to SiC, since it occurs reproducibly in only one polytype (e.g. 2H) and can be obtained in layers of usable thicknesses or large areas (e.g. as large as the substrate wafers employed). This makes it particularly well suited as a compound substrate on which to grow epitaxially the related materials SiC and AlN where lattice parameters closely match.

The new single crystals of the present invention are suitable for most uses that have been proposed for SiC or AlN hetero-junctions and field effect electronic devices and light generating and cold cathode devices. Also, the crystals of the present invention can be employed as optical filters. Moreover, since the lattice constants of the crystals of the present invention are very close to those of SiC and AlN, such can be used in hetero-junctions with SiC and/or AlN.

Figure 3:
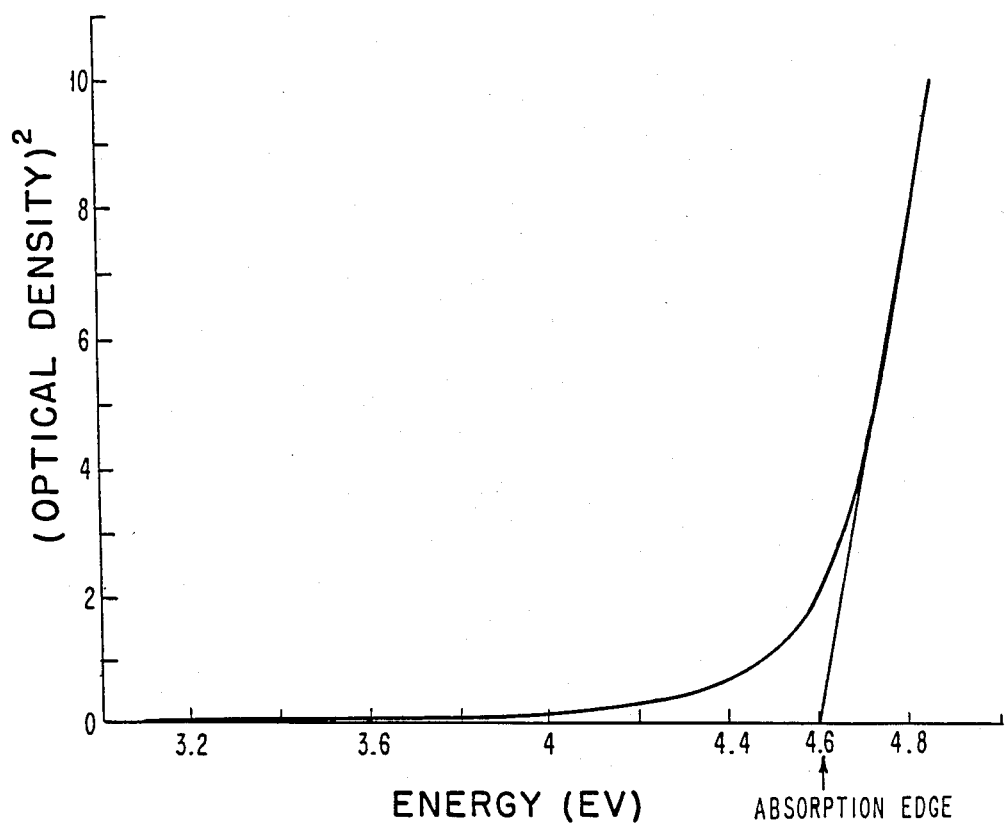
FIG. 3 is a graph of the square of the optical density squared vs. energy of the absorbed photons.

FIG. 3 is a graph of the square of measured optical density verses absorbed photons for an $(SiC)_x(AlN)_{1-x}$ crystal of the present invention wherein x is 0.435 and the $C_x$ lattice parameter is 5.0106 Å. The graph illustrates the manner in which extrapolation of the straight line portion of the curve illustrates the absorption edge.

What is claimed is:

1. Structure containing epitaxial crystals of $(SiC)_x(AlN)_{1-x}$ on a substrate wherein x is about 0.2 to about 0.5, and wherein said substrate is selected from the group of $Al_2O_3$ and AlN C-axis crystals.

2. The structure of claim 1 wherein x is about 0.5.

3. The structure of claim 1 wherein said crystals are about 1 to about 10 microns thick.

4. The structure of claim 1 wherein the crystals are 2H crystalline form.

5. The structure of claim 1 wherein said C-axis lattice is about 5.0152 to about 5.0038 Å.

6. The structure of claim 1 wherein the absorption edge of said crystals is about 4.3 to about 4.8 eV.

7. The structure of claim 1 wherein said substrate is $Al_2O_3$.

8. The structure of claim 1 wherein said substrate is <0001> oriented $Al_2O_3$.

* * * * *